United States Patent
Park

(10) Patent No.: US 9,515,480 B2
(45) Date of Patent: Dec. 6, 2016

(54) POWER DEVICE FOR PREVENTING MALFUNCTION

(71) Applicant: LSIS CO., LTD., Anyang-si, Gyeonggi-do (KR)

(72) Inventor: Kyung Won Park, Seongnam-si (KR)

(73) Assignee: LSIS CO., LTD., Anyang-si (KR)

( * ) Notice: Subject to any disclaimer, the term of this patent is extended or adjusted under 35 U.S.C. 154(b) by 130 days.

(21) Appl. No.: 14/461,770

(22) Filed: Aug. 18, 2014

(65) Prior Publication Data
US 2015/0062767 A1 Mar. 5, 2015

(30) Foreign Application Priority Data
Aug. 30, 2013 (KR) .................. 10-2013-0104330

(51) Int. Cl.
*H02H 3/00* (2006.01)
*H02H 9/00* (2006.01)
(Continued)

(52) U.S. Cl.
CPC .............. *H02H 9/005* (2013.01); *G01R 19/25* (2013.01); *G01R 31/025* (2013.01); *H02H 1/04* (2013.01);
(Continued)

(58) Field of Classification Search
USPC .................................... 361/86–87, 91.1, 42
See application file for complete search history.

(56) References Cited

U.S. PATENT DOCUMENTS

| 6,075,368 A | 6/2000 | Schumacher et al. |
| 7,268,989 B2 * | 9/2007 | Parker ............... H02H 1/0015 361/42 |

(Continued)

FOREIGN PATENT DOCUMENTS

| JP | 2000-156930 | 6/2000 |
| JP | 2007-315911 | 12/2007 |

(Continued)

OTHER PUBLICATIONS

Korean Intellectual Property Office Application Serial No. 10-2013-0104330, Notice of Allowance dated Apr. 2, 2015, 2 pages.

(Continued)

*Primary Examiner* — Danny Nguyen
(74) *Attorney, Agent, or Firm* — Lee, Hong, Degerman, Kang & Waimey

(57) ABSTRACT

The protecting relay may include: an input conversion unit configured to receive the analog signal and sample the analog signal according to a pre-set sampling period; a multiplexer configured to selectively output any one of a plurality of signals output from the input conversion unit; a programmable gain amplifier (PGA) configured to set different gain values according to signals output from the multiplexer, and amplify a signal output from the multiplexer with a pre-set gain value; an analog-to-digital converter (ADC) configured to convert an analog signal output from the PGA into a digital signal; and a controller configured to determine whether the analog signal received through the input conversion unit includes a surge signal based on the plurality of sampled data which have been converted into the digital signal, and determine whether to perform a relay function based on the determination results.

5 Claims, 2 Drawing Sheets

(51) Int. Cl.
*G01R 31/02* (2006.01)
*H02H 1/04* (2006.01)
H02H 9/02 (2006.01)
G01R 19/25 (2006.01)
H02H 9/04 (2006.01)

(52) U.S. Cl.
CPC ............ *G01R 19/2506* (2013.01); *H02H 9/02* (2013.01); *H02H 9/04* (2013.01)

(56) References Cited

U.S. PATENT DOCUMENTS

2010/0219838 A1* 9/2010 Prabhu K ............ H02H 1/0015
324/509
2012/0126771 A1* 5/2012 Tuten ................. G01R 19/0053
323/284

FOREIGN PATENT DOCUMENTS

KR 10-2010-0101980 9/2010
KR 10-1064454 9/2011

OTHER PUBLICATIONS

European Patent Office Application Serial No. 14180783.4, Search Report dated Nov. 3, 2014, 7 pages.
Korean Intellectual Property Office Application Serial No. 10-2013-0104330, Office Action dated Jul. 11, 2014, 4 pages.

* cited by examiner

POWER DEVICE FOR PREVENTING MALFUNCTION

CROSS-REFERENCE TO RELATED APPLICATION

Pursuant to 35 U.S.C. §119(a), this application claims the benefit of earlier filing date and right of priority to Korean Application No. 10-2013-0104330, filed Aug. 30, 2013, the contents of which are all hereby incorporated by reference herein in its entirety.

BACKGROUND OF THE INVENTION

1. Field of the Invention

The present disclosure relates to a power device for preventing malfunction, and more particularly, to a power device for preventing malfunction of a protecting device by determining whether a signal delivered from an electric power system to the power device is a surge signal.

2. Background of the Invention

In general, an electric power system has various transmission facilities to supply power generated by a generator to consumers, and power generated by the generator is supplied to consumers through various power transmission and reception facilities midway.

Power facilities are designed based on a normal power flow, but when power facilities are broken down, an overvoltage, an insufficient voltage, an overcurrent, frequency fluctuation, and the like, occurs, hampering power supply to consumers and negatively affecting the facilities, and thus, a fault section needs to be promptly separated at an initial stage to remove factors which have caused the breakdown.

A device that senses such a breakdown and transmits a cutoff signal to a circuit breaker is known as a protecting relay, and as protecting relays have been changed from the past induction relays or static relays to digital relays, it is required to detect a current of an accurate range over a larger correction range.

When surge (for example, lightning surge, switching surge, or the like) generated in an electric power system is introduced to a protecting relay, the protecting relay, recognizing the surge as a signal (for example, a voltage or a current), performs a relaying function, and thus, a relay malfunctions due to the surge.

SUMMARY OF THE INVENTION

Therefore, an aspect of the detailed description is to provide a power device for preventing malfunction of a protecting device by determining whether a signal delivered from an electric power system to the power device is a surge signal.

Another aspect of the detailed description is to provide a power device for preventing malfunction capable of processing a signal generated by an electric power system, sampling the processed signal, and determining whether the signal is a surge signal based on the sampled data.

To achieve these and other advantages and in accordance with the purpose of this specification, as embodied and broadly described herein, a power device that receives an analog signal generated by a certain electric power system and processes the analog signal, wherein the analog signal is converted into a digital signal to obtain a plurality of sampled data, a plurality of slopes are calculated based on two or more continued sampled data among the plurality of sampled data, whether signs of the plurality of calculated slopes have been changed is determined, and it is determined that the analog signal includes a surge signal when the signs of the plurality of calculated slopes have been changed, thus controlling an operation of a protecting device.

The power device may be any one of a protecting relay, a phasor measurement unit (PMU), and a measurement device.

The protecting device may include: an input conversion unit configured to receive the analog signal and sample the analog signal according to a pre-set sampling period; a multiplexer configured to selectively output any one of a plurality of signals output from the input conversion unit; a programmable gain amplifier (PGA) configured to set different gain values according to signals output from the multiplexer, and amplify a signal output from the multiplexer with a pre-set gain value; an analog-to-digital converter (ADC) configured to convert an analog signal output from the PGA into a digital signal; and a controller configured to determine whether the analog signal received through the input conversion unit includes a surge signal based on the plurality of sampled data which have been converted into the digital signal, and determine whether to perform a relay function based on the determination results.

The controller may calculate a plurality of slopes based on two or more continued sampled data among the plurality of sampled data.

The controller may determine whether sings of the plurality of calculated slopes have been changed.

When the signs of the plurality of calculated slopes have been changed according to the determination results, the controller may determine that the analog signal includes a surge signal, withhold performing the relay function, generate alarm information, and output the generated alarm information.

When the signs of the plurality of calculated slopes have not been changed according to the determination results, the controller may determine that the analog signal does not include a surge signal, and perform the relay function.

According to an embodiment of the present disclosure, when surge generated in an electric power system is introduced to a power device, whether the surge is a surge signal is determined, whereby malfunction may be effectively prevented, without affecting a degradation of performance of the overall system.

According to an embodiment of the present disclosure, a signal generated by an electric power system is processed and sampled, and whether surge is a surge signal is determined based on the sampled data, whereby the relay function is performed only when the received signal is a normal signal, thus preventing malfunction of the relay.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Figure 1:
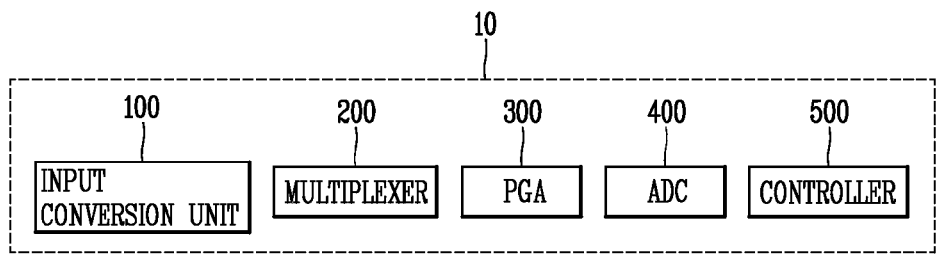
FIG. 1 is a block diagram illustrating a configuration of a protecting relay of a power device according to an embodiment of the present disclosure.

FIG. 1 is a block diagram illustrating a configuration of a protecting relay of a power device according to an embodiment of the present disclosure;

As illustrated in FIG. 1, a protecting relay 10 includes an input conversion unit 100, a multiplexer 200, a programmable gain amplifier (PGA) 300, an analog-to-digital converter (ADC) 400, and a controller 500. The components of the protecting relay 10 illustrated in FIG. 1 are not essential and the protecting relay 10 may be implemented with more or less components.

The input conversion unit 100 receives an analog signal (for example, a signal corresponding to a voltage or a current) generated in a certain electric power system.

Namely, the input conversion unit 100 receives an analog signal delivered after being generated by the electric power system.

Also, the input conversion unit 100 samples the received analog signal according to a pre-set sampling period and outputs the sampled signal.

The input conversion unit 100 holds the current sampled data until when a next sample is obtained.

The multiplexer 200 selectively outputs any one of a plurality of signals output from the input conversion unit 100.

The PGA 300 sets different gain values according to signals output from the multiplexer 200.

Namely, the PGA 300 sets (previously stores) a gain value corresponding to each signal output from the multiplexer 200.

The PGA 300 amplifies a signal output from the multiplexer 200 with a pre-set gain value.

The ADC 400 converts an analog signal output from the PGA 300 into a digital signal.

Namely, the ADC 400 converts an analog signal output from the PGA 300 into a digital signal, and outputs sampled data.

The controller (or a central processing unit (CPU)) 500 controls a general operation of the overcurrent relay 10.

Also, the controller 500 determines whether a surge signal is included in the analog signal received through the input conversion unit 100 after being delivered from the electric power system based on a plurality of sampled data which have been converted into digital signals output from the ADC 400.

Namely, the controller 500 calculates a plurality of slopes based on two or more continued sampled data among the plurality of sampled data.

Also, the controller 500 compares signs of the plurality of calculated slopes to determine whether the signs are different (or whether the signs have been changed).

Also, when it is determined that a surge signal is included in the analog signal received through the input conversion unit 100, the controller 500 holds (or stops) performing a relay function, generates alarm information, and outputs the generated alarm information to a display unit (not shown) and/or a voice output unit (not shown). Here, the surge signal is a signal including every frequency band, so it may be delivered to the ADC 400 although a low-pass filter is used, such that the controller 500 may recognize the corresponding signal as a normal signal and regard it as sampled data for calculating an effective value. However, since whether a surge signal is included is determined by comparing a plurality of slopes based on the sampled data, malfunction may be prevented.

Namely, when signs of the plurality of slopes have been changed (or fluctuated) according to the results obtained by comparing the plurality of calculated slopes, the controller 500 may determine that a surge signal is included in the analog signal received through the input conversion unit 100, withholds (or stops) performing the relay function, generates the alarm information, and outputs the generated alarm information through the display unit and/or the voice output unit.

Also, when it is determined that a surge signal is not included in the analog signal received through the input conversion unit 100, the controller 500 normally performs the relay function.

Namely, when signs of the plurality of calculated slopes have not been changed according to the results obtained by comparing the plurality of calculated slopes, the controller 500 determines that a surge signal is not included in the analog signal received through the input conversion unit 100 and only a normal signal is included in the analog signal, and normally performs the relay function.

Also, in the embodiment of the present disclosure, the protecting relay (or a protecting IED) 10 is described as an example, but the present disclosure is not limited thereto and the functions (for example, functions of calculating a plurality of continued slopes based on the plurality of sampled data, and whether a surge signal is included is determined by determining whether signs of the plurality of calculated slopes has been changed) of the controller may be applied to a power device such as a phasor measurement unit (PMU), a measurement device, or the like, as well as the protecting relay to identify a surge signal input to a corresponding power device to prevent malfunction of the corresponding power device.

In this manner, when a signal generated by an electric power system is introduced to the protecting relay, whether it is a surge signal may be determined.

Also, a signal generated by an electric power system is processed, and the processed signal is sampled, and whether a surge signal is included may be determined based on the sampled data.

Hereinafter, a method for controlling a protecting relay according to an embodiment of the present disclosure will be described with reference to FIGS. 1 through 3.

Figure 2:
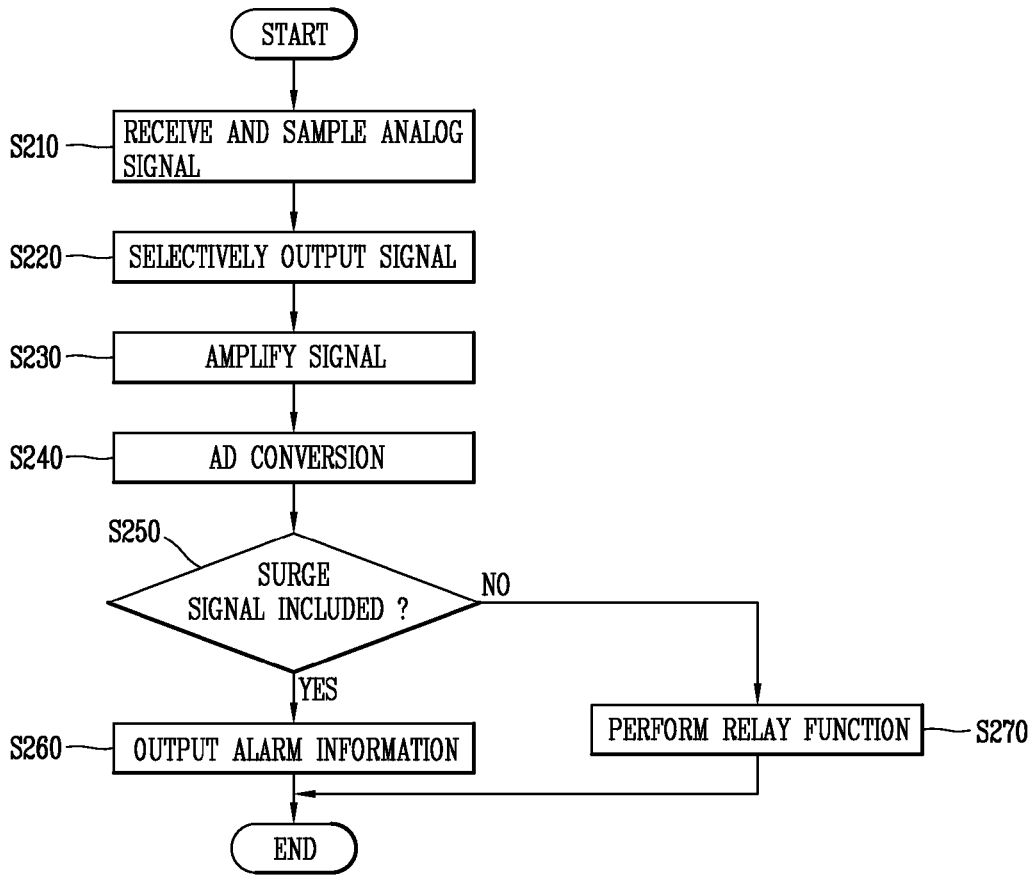
FIG. 2 is a flow chart illustrating a method for controlling a protecting relay of a power device according to an embodiment of the present disclosure.
Figure 3:
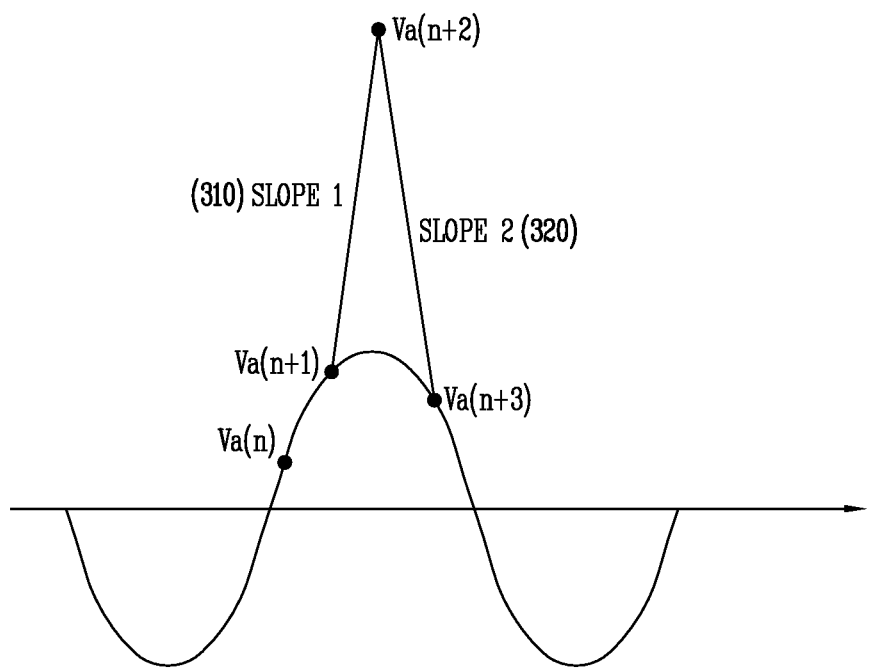
FIG. 3 is a view illustrating comparison between slops of the power device according to an embodiment of the present disclosure.

FIG. 2 is a flow chart illustrating a method for controlling a protecting relay of a power device according to an embodiment of the present disclosure.

First, the input conversion unit 100 receives an analog signal (for example, a signal corresponding to a voltage or a current) generated in a certain electric power system.

Also, the input conversion unit 100 samples the received analog signal according to a pre-set sampling period and outputs the sampled signal.

Also, the input conversion unit 100 holds the current sampled data until when a next sample is obtained (S210).

Thereafter, the multiplexer 200 selectively outputs any one of a plurality of signals output from the input conversion unit 100 (S220).

The PGA 300 sets different gain values according to signals output from the multiplexer 200, amplifies a signal output from the multiplexer 200 with a pre-set gain value, and outputs the amplified signal (S230).

Thereafter, the ADC 400 converts an analog signal output from the PGA 300 into a digital signal, and outputs the digital signal (S240).

Thereafter, the controller 500 determines whether a surge signal is included in the analog signal received through the input conversion unit 100 after being delivered from the electric power system based on a plurality of sampled data which have been converted into digital signals output from the ADC 400.

Namely, the controller 500 calculates a plurality of slopes based on two or more continued sampled data among the plurality of sampled data which have been converted into the digital signal output from the ADC 400. Also, the controller 500 compares signs of the plurality of calculated slopes to determine whether the signs are different (or whether the signs have been changed).

For example, the controller 500 calculates a first slope based on first to third sampled data among first to fifth sampled data which have been converted into the digital signals, calculates a second slope based on the second to fourth sampled data, and calculates a third slope based on the third to fifth sampled data. Thereafter, the controller 500 compares signs of the calculated first, second and third slopes to determine whether the signs are different (or whether the signs have been changed) (S250).

Thereafter, when it is determined that the analog signal received through the input conversion unit 100 includes a surge signal, the controller 500 withholds (or stops) performing the relay function, generates alarm information, and outputs the generated alarm information.

For example, when it is determined that the signs of the first to third continued slopes have been changed such that first calculated slope 1 310 is "+", the second slope 320 is "−", and the third slope is "−" according to the results obtained by determining whether the signs of the first to third calculated slopes, the controller 500 determines that the analog signal received through the input conversion unit 100 includes a surge signal, withholds performing the relay function, generates alarm information, and outputs the generated alarm signal through a display unit (not shown) and/or voice output unit (not shown) (S260).

Also, when it is determined that the analog signal received through the input conversion unit 100 does not include a surge signal according to the determination results, the controller 500 normally performs the relay function.

For example, when all of the signs of the first, second, and third slopes are identical as being "+" (or "−") according to the results of determining whether the signs of the first to third calculated slopes have been changed, the controller 500 determines that the analog signal received through the input conversion unit 100 does not include a surge signal, namely, determines that the received analog signal is a normal signal, and performs the relay function (S270).

As described above, according to the embodiment of the present disclosure, when surge generated in an electric power system is introduced to a power device, whether the surge is a surge signal is determined, whereby malfunction may be effectively prevented, without affecting a degradation of performance of the overall system.

As described above, according to the embodiment of the present disclosure, a signal generated by an electric power system is processed and sampled, and whether surge is a surge signal is determined based on the sampled data, whereby the relay function is performed only when the received signal is a normal signal, thus preventing malfunction of the relay.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A power device configured to receive and process an analog signal generated by a certain electric power system, the power device comprising:
   an input conversion unit configured to receive the analog signal and sample the analog signal according to a pre-set sampling period;
   a multiplexer configured to selectively output any one of a plurality of signals output from the input conversion unit;
   a programmable gain amplifier (PGA) configured to set different gain values according to signals output from the multiplexer and amplify a signal output from the multiplexer with a pre-set gain value;
   an analog-to-digital converter (ADC) configured to convert analog signals output from the PGA into digital signals to obtain a plurality of sampled data; and
   a controller controlling operation of a protecting device, the controller configured to:
      determine whether the analog signal received through the input conversion unit includes a surge signal based on the plurality of sampled data;
      determine whether to perform a relay function based on the determination results;
      calculate a plurality of slopes based on two or more continued sampled data among the plurality of sampled data;
      determine whether signs of the plurality of calculated slopes have been changed; and
      determine that the analog signal includes a surge signal when the signs of the plurality of calculated slopes have been changed.

2. The power device of claim 1, wherein the controller is further configured to withhold performing the relay function, generate alarm information, and output the generated alarm information when the analog signal includes a surge signal.

3. The power device of claim 1, wherein the controller is further configured to determine that the analog signal does not include a surge signal and perform the relay function when the signs of the plurality of calculated slopes have not been changed.

4. The power device of claim 1, wherein the power device is any one of a protecting relay, a phasor measurement unit (PMU), or a measurement device.

5. The power device of claim 2, wherein the controller is further configured to determine that the analog signal does not include a surge signal and performs the relay function when the signs of the plurality of calculated slopes have not been changed.

* * * * *